United States Patent [19]

Betts et al.

[11] Patent Number: 4,771,232

[45] Date of Patent: Sep. 13, 1988

[54] NON-INTERRUPTIVE SPECTRUM ANALYZER FOR DIGITAL MODEMS

[75] Inventors: William L. Betts, St. Petersburg; Edward S. Zuranski, Largo, both of Fla.

[73] Assignee: Paradyne Corporation, Largo, Fla.

[21] Appl. No.: 140,481

[22] Filed: Jan. 4, 1988

[51] Int. Cl.[4] .............................. G01R 23/16
[52] U.S. Cl. .................. 324/77 B; 324/77 H
[58] Field of Search ............. 324/77 B, 77 R, 77 H, 324/77 E, 77 F; 364/484, 485; 379/6, 28

[56] References Cited

U.S. PATENT DOCUMENTS

| | | | |
|---|---|---|---|
| 3,836,735 | 9/1974 | Bradley | 379/6 |
| 3,985,980 | 10/1976 | Bradley | 379/6 |
| 4,093,989 | 6/1978 | Flink et al. | 324/77 B |
| 4,451,782 | 5/1984 | Ashida | 324/77 H |

Primary Examiner—Stewart J. Levy
Assistant Examiner—Louis M. Arana
Attorney, Agent, or Firm—Kane, Dalsimer, Sullivan, Kurucz, Levy, Eisele, and Richard

[57] ABSTRACT

A system and method are provided which allow a user to obtain a plot of the amplitude response of a channel such as a telephone line in the band occupied by a modem signal without interrupting or affecting the data traffic through the modem. No test tones are required for $M_e$ spectral measurements, i.e., the system extracts spectral data from the actual received modem signal that has been shaped by the amplitude characteristics of the line. The amplitude characteristics are displayed on an external oscilloscope using a modem eye pattern display.

5 Claims, 3 Drawing Sheets

NON-INTERRUPTIVE SPECTRUM ANALYZER FOR DIGITAL MODEMS

This application is somewhat related to the commonly assigned U.S. application entitled "Adaptive Transmit Preemphasis for Digital Modems"

BACKGROUND OF THE INVENTION

1. Field of the Invention

The invention relates to a system for providing a modem user with a plot of the amplitude response of a channel such as a telephone line in the frequency band occupied by the modem signal without interrupting or otherwise affecting data signal traffic through the modem.

2. Description of the Prior Art

One of the many channel parameters affecting modem performance is the amplitude spectral characteristic of the channel. Severe band edge rolloff and ripples in the amplitude response can impair modem performance. Given spectrum information, the user can take appropriate action such as contacting the telephone company to correct telephone line problems.

In order to obtain the amplitude characteristics of a channel such as a telephone line, the modems on the line must be removed and test equipment installed at both ends of the line to make the meauurement. This method interrupts customer data traffic for the duration of the test.

SUMMARY OF THE INVENTION

The invention provides a user with a plot of the amplitude response of a channel such as a telephone line in the band occupied by the modem signal without interrupting or affecting data signal traffic through the modem. No test tones are required for $M_e$ spectral measurements, i.e., the inventive circuit extracts spectral data from the actual received modem signal that has been shaped by the amplitude characteristics of the line. The amplitude characteristics are displayed on an external oscilloscope using a modem eye pattern display.

DETAILED DESCRIPTION OF THE PREFERRED EMBODIMENT

The invention provides a plot of the amplitude response of a telephone line by measuring the energy present at 32 frequencies from 300 Hz to 3400 Hz spaced 100 Hz apart. The data collected at the 32 points are stored in a 32 location memory buffer for display. A display function extracts the data from each of 32 memory locations at a rate sufficient to display a complete plot on an oscilloscope.

Figure 1:
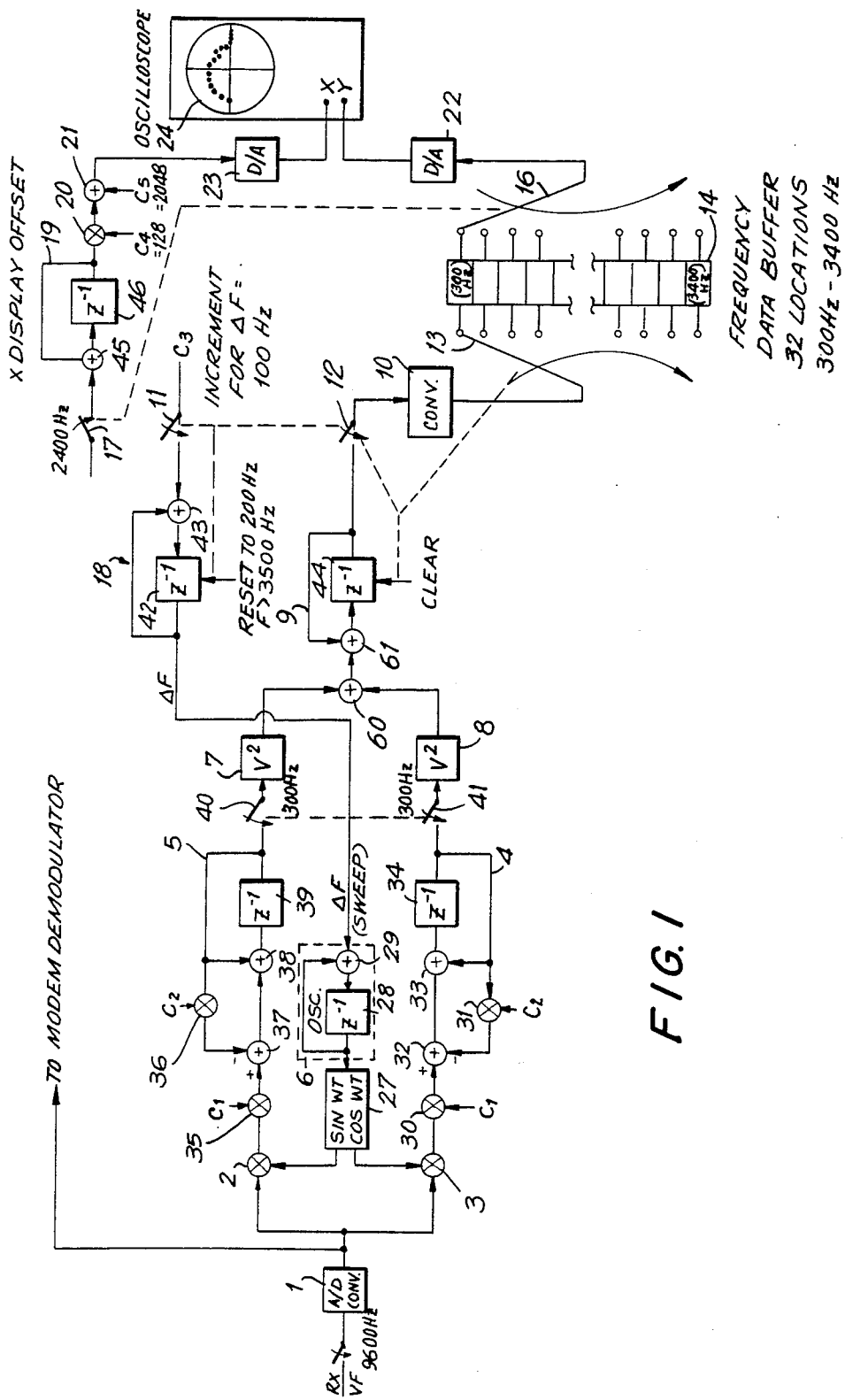
FIG. 1 is a schematic of the non-interruptive spectrum analyzer system of the present invention.

A block diagram of the inventive system is shown in FIG. 1. Analog receiver data signals are sampled by A/D converter 1 at a 9600 Hz rate. The sampled data are passed to the inventive circuit and to a modem demodulator for normal processing. In the inventive circuit the sampled data are mixed by the quadrature amplitude demodulator 2, 3 with oscillator 6 (not shown in FIG. 1), after it has been modified by sine and cosine lookup element 27, to provide the selected one of 32 frequencies. Oscillator 6 comprises a delay element 28 and a summer 29. The in-phase and quadrature data are filtered by low pass filters 4 and 5 respectively to remove the double frequency components of the mixing operation. Low pass filter 4 comprises multiplier element 30 for multiplying by a scaling constant and multiplier element 31 for multiplying by a filter constant, summers 32 and 33 and delay element 34. Low pass filter 5 comprises multiplier element 35 for multiplying by a scaling constant and multiplier element 36 for multiplying by a filter constant, summers 37 and 38, and delay element 39. The outputs of low pass filters 4 and 5 contain a DC output that is proportional to the instantaneous energy present at the frequency selected by oscillator 6. The outputs of LPFs 4 and 5 are sampled at a 300 Hz rate by sampler switches 40 and 41 (in order to reduce processor load) and squared by elements 7, 8. The outputs of squaring units 7 and 8 are summed and integrated by an ideal integrator 9. Integrator 9 has an input from summer 60 and consists of summer 61 and a delay element 44. Integrator 9 integrates the energy present at the selected frequency for 13 seconds in order to obtain an accurate measurement. At the end of the 13 second integration period switch 12 closes, the output of integrator 9 is converted to a logarithmic scale by converter 10 and the log value is stored in the appropriate frequency data memory locations in frequency data buffer 14. After the data is stored in buffer 14, integrator 9 is cleared, commutator 13 moves to the next frequency memory location in buffer 14, the frequency selection is incremented 100 Hz by integrator 18 which comprises delay element 42, and summer 43, and the integration begins at the new frequency. Switch 11 is used to load a constant into integrator 18. The constant is preselected so as to provide a 100 Hertz increment to the oscillator 6. This process repeats continuously updating all 32 memory locations.

In order to display the spectral measurements, the data in 14 must be presented at a much faster rate than it was stored. Thus, commutator 16 rotates through each of the 32 memory locations at a 2400 Hz rate. The digital data contained in the frequency memory location is converted to analog by D/A converter 22 and applied to the Y input of an external oscilloscope 24. Coincident with the movement of commutator 16, switch 17 closes to increment the X display offset generator 19 which comprises summer 45 and delay element 46. Device 19 generates a ramp that is scaled by elements 20, 21, converted to analog by D/A converter 23 and applied to the X input of oscilloscope 24. This X input spaces the 32 frequency data points to provide a display shown on oscilloscope 24 and FIGS. 2 and 3.

Figure 2:
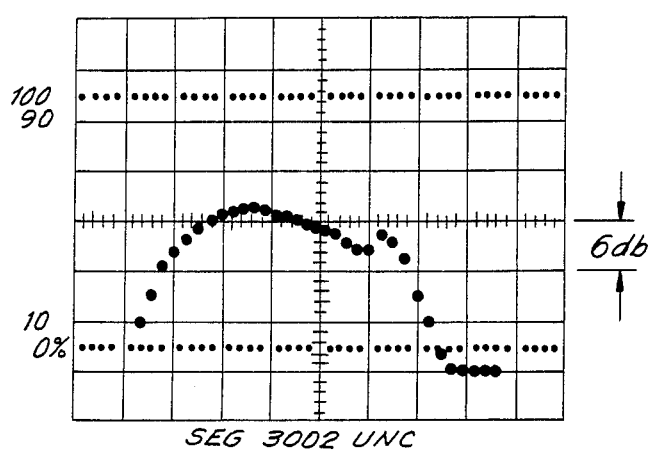
FIGS. 2 and 3 respectively show reproductions of photographs of plots of a sampled output of the circuit of the present invention as compared to a measurement made with a Halcyon 520B3 telephone line tester.
Figure 3:
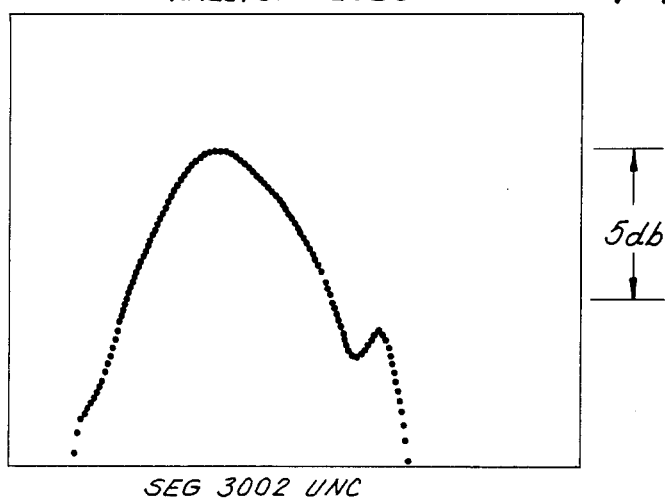

FIGS. 2 and 3 respectively show a sample output of the inventive circuit as compared to an output from Halcyon 520B3 telephone line tester. An important consideration is that the results achieved by the modem spectrum analyzer of the present invention as shown in FIG. 2 do not require the test tones which would be required for the measurements shown in FIG. 3.

The analyzer output can be converted to decibels by a log table to give greater dynamic range. A full scale log table can be implemented by shifting and counting shifts until the desired mantissa accuracy is achieved for a look-up table. The log scale can be computed each time a new frequency is selected.

With regard to the logarithmic conversion table shown below, the modem digital AGC word is scaled for 3 dB=hexadecimal 100. Numbers within the modem processor can be converted to the same scale by shifting and counting shifts to determine the characteristic, and then computing the mantissa by the look-up table. For each shift of V add hexadecimal 200 to the characteristic and for $V^2$ add hexadecimal 100. When the shifted value is less than hexadecimal 010 then look up the mantissa in a 16 entry table. An entry table is accurate to $\frac{1}{2}$ dB. The output is converted to dBs by the factors 3.01 dB/$256_{10}$.

The following is a step by step summation of the procedure:
1. Compute $V^2$. If $V^2$ is greater than or equal to 008 then dB=0 and exit.
2. Test if $V^2$ is less than 16 and skip to #5 if true.
3. Shift $V^2$ right ($\frac{1}{2}$) and add 256 to dB
4. Repeat 2 and 3 until test #2 passes.
5. Compute base address $+V^2-008$.
6. Look up mantissa and add to dB for final value.

| V | $V^2$ | shift | dB Sum | level | remainder | mantissa | level |
|---|---|---|---|---|---|---|---|
| 2048 | 1024 | 7 | 1792 | 21 dB | 15 | 232 | 2.73 dB |
| 1448 | 512 | 6 | 1536 | 18 dB | 14 | 207 | 2.43 dB |
| 1024 | 256 | 5 | 1280 | 15 dB | 13 | 179 | 2.11 dB |
| 724 | 128 | 4 | 1024 | 12 dB | 12 | 150 | 1.76 dB |
| 512 | 64 | 3 | 768 | 9 dB | 11 | 118 | 1.38 dB |
| 362 | 32 | 2 | 512 | 6 dB | 10 | 82 | 0.97 dB |
| 256 | 16 | 1 | 256 | 3 dB | 9 | 44 | 0.51 dB |
| 181 | 8 | 0 | 0 | 0 dB | 8 | 0 | 0.00 dB |

Figure 4:
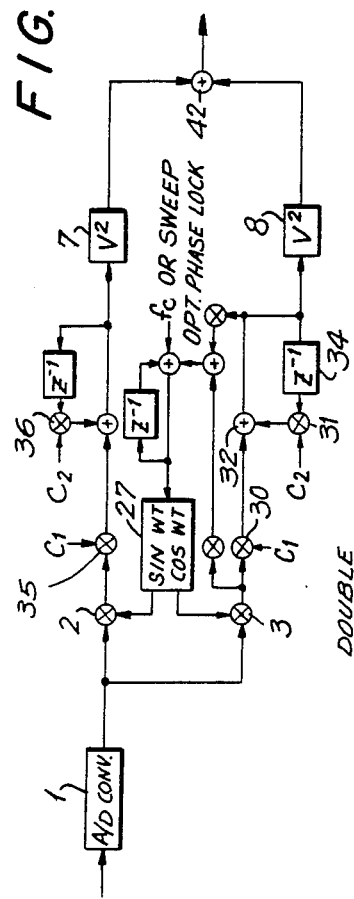
FIG. 4 is a schematic of a portion of the circuit shown in FIG. 1.
Figure 5:
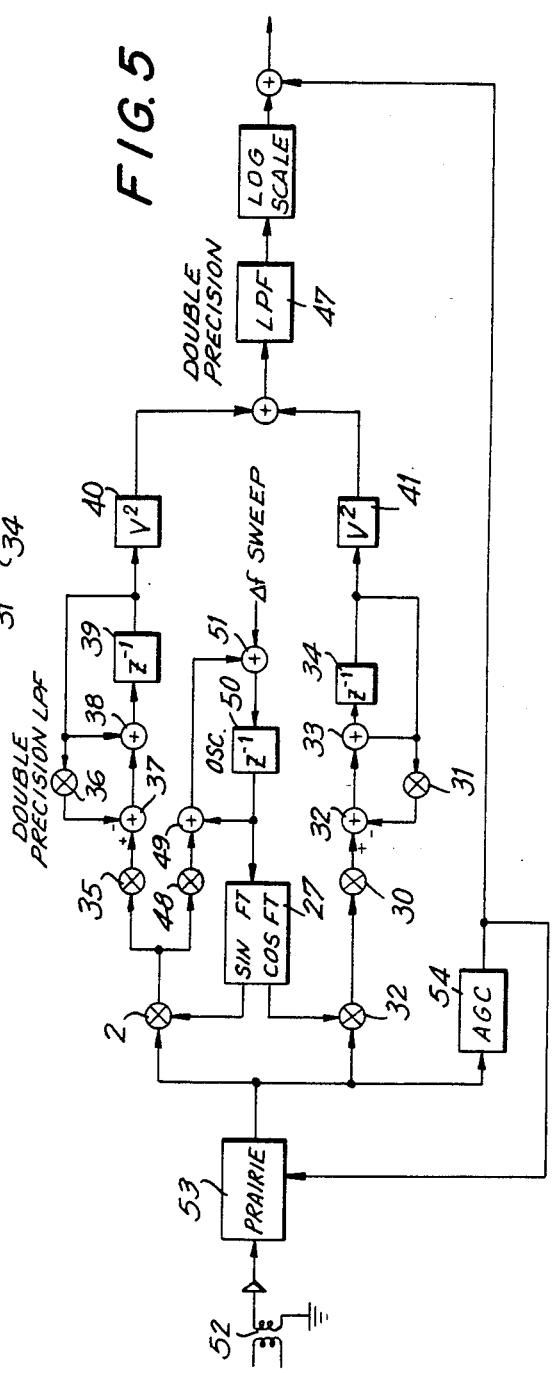
FIG. 5 shows a schematic of a portion of the circuit of FIG. 1 with the addition of a double precision low-pass filter and an automatic gain control loop.

FIG. 5 shows a schematic of a portion of the circuit of FIG. 1 with the addition of a double precision low pass filter and a Prairie Corporation automatic gain control loop. As with FIG. 4, elements which are the same as those shown in FIG. 1 have the same reference numerals. Additional elements include low pass filter 47, multiplier 48, summer 49, integrator 50, summer 51, transformer 52, modem digital automatic gain control module 53, and automatic gain control module 54.

The double precision filters are required for a band width on the order of 1 second in the loop. A small phase error is added to oscillator 50 to enable the "tracking" filters to detect tones that may not be exactly on the sweep frequency which is generated in 100 Hz increments. The $V^2$ modules 40 and 50 require a double precision filter due to the wide dynamic range of $V^2$. The modem automatic gain control AGC module 53 is added to the LOG scaled output for absolute calibration (3.01 dB/$256_{10}$).

Advantages of the aforestated invention include the fact that it improves on the prior art in not interrupting data traffic and not requiring external equipment to perform an amplitude spectral analysis. Integrating the diagnostic tools into the system itself not only provides more features for users but aids fields service personnel and users in problem solving without additional test equipment.

Although a preferred embodiment of the invention has been shown herein, it will be appreciated that many other embodiments can be contemplated within the scope of the appended claims.

What is claimed is:
1. A non-interruptive spectrum analyzer for digital systems comprising:
  means for receiving an analog signal from a communications channel such as a telephone line and converting said signal to digital form;
  means for quadrature amplitude demodulating said digital signal whereby two digital signals phase spaced 90 degrees apart are created;
  an oscillator having an output connected to said quadrature amplitude demodulating means whereby a selected one of a plurality of passable frequencies is produced in said two phase spaced digital signals;
  two low pass filters, each filter respectively having an input from one of said two spaced digital signals;
  two switches each of which respectively functions to sample a D.C. output from one of said two low pass filters at a preselected rate;
  two elements each functioning to square one of said sampled D.C. outputs;
  a summer for combining said squared signals;
  an ideal integrator connected to an output of said summer;
  a timing switch connected to an output of said integrator;
  a converter connected to an output of said timing switch and functioning to convert linear signals received therefrom to logarithmic signals;
  a buffer comprising a plurality of frequency data memory locations;
  a first commutator connected to an output of said converter and functioning to convey signals therefrom sequentially to said frequency data memory locations in said buffer;
  a second commutator connected sequentially to outputs of said frequency data memory locations;
  a first digital to analog converter connected to an output of said second commutator and functioning to produce a signal which can be used for "Y" input to an extremed oscilloscope;
  a switch which moves synchronously with the movement of said second commutator and connected to an input of an oscilloscope "X" display offset generator; and
  a second digital to analog converter connected to an output of said "X" display offset generator.
2. The analyzer of claim 1 wherein said two low pass filters constitute a double precision filter each of said low pass filter comprising a first summer, a multiplier connected to an output of said first summer, a second summer connected to respective outputs from said first summer and said multiplier, and an integrator connected to an output of said second summer.
3. The spectrum analyzer of claim 1 wherein said "X" display offset generator comprises a summer, an integrator connected to an output of said summer, and a feedback path from an output of said integrator to said summer.
4. The spectrum analyzer of claim 1 further comprising an oscilloscope where "X" input is connected to an output of said second digital to analog converter and said "Y" input is connected to an output of said first digital to analog converter.
5. The spectrum analyzer of claim 1 further comprising an automatic gain control module having an input from said means for receiving and converting and an output to said summer for combining said squared signals.

* * * * *